United States Patent
Feiner et al.

(10) Patent No.: US 10,762,255 B2
(45) Date of Patent: Sep. 1, 2020

(54) REFINEMENT OF FINITE ELEMENT MODEL OF INTEGRALLY BLADED DISK

(71) Applicant: Blade Diagnostices Corporation, Pittsburgh, PA (US)

(72) Inventors: Drew M. Feiner, New Orleans, LA (US); Jerry H. Griffin, Dunedin, FL (US)

(73) Assignee: Blade Diagnostices Corporation, Pittsburgh, PA (US)

( * ) Notice: Subject to any disclaimer, the term of this patent is extended or adjusted under 35 U.S.C. 154(b) by 0 days.

(21) Appl. No.: 16/618,197

(22) PCT Filed: Mar. 1, 2019

(86) PCT No.: PCT/US2019/020230
§ 371 (c)(1),
(2) Date: Nov. 29, 2019

(87) PCT Pub. No.: WO2019/209410
PCT Pub. Date: Oct. 31, 2019

(65) Prior Publication Data
US 2020/0159879 A1    May 21, 2020

Related U.S. Application Data

(60) Provisional application No. 62/661,656, filed on Apr. 24, 2018.

(51) Int. Cl.
G06F 30/23  (2020.01)
G06F 30/17  (2020.01)
G01M 7/02   (2006.01)
G01M 15/14  (2006.01)

(52) U.S. Cl.
CPC ............. *G06F 30/23* (2020.01); *G01M 7/025* (2013.01); *G06F 30/17* (2020.01); *G01M 15/14* (2013.01)

(58) Field of Classification Search
CPC ........ G06F 30/23; G06F 30/17; G01M 7/025; G01M 15/14
See application file for complete search history.

(56) References Cited

U.S. PATENT DOCUMENTS

| 5,590,261 A | 12/1996 | Sclaroff et al. |
| 7,082,371 B2 | 7/2006 | Griffin et al. |
| 7,206,709 B2 | 4/2007 | Griffin et al. |

(Continued)

OTHER PUBLICATIONS

Vargiu et al. "A reduced order model based on sector mistuning for the dynamic analysis of mistuned bladed disks". International Journal of Mechanical Sciences 53 (2011). p. 639-646. (Year: 2011).*

(Continued)

*Primary Examiner* — Eunhee Kim
(74) *Attorney, Agent, or Firm* — David G. Maire

(57) ABSTRACT

A reduced order model of an integrally bladed turbine disk (IBD) is used with experimental vibrational test data to modify a finite element model (FEM) of the IBD so that the FEM more accurately predicts the vibrational mistuning of the disk. The refined FEM can be used to evaluate a proposed modification of the IBD before the hardware is actually modified, and to evaluate the actual modification if there is a difference between the proposed and actual modifications.

16 Claims, 5 Drawing Sheets

(56) References Cited

U.S. PATENT DOCUMENTS

| | | | |
|---|---|---|---|
| 7,383,136 | B1 | 6/2008 | Griffin et al. |
| 9,710,880 | B2 | 7/2017 | Xu et al. |
| 2004/0243310 | A1* | 12/2004 | Griffin ............... G01H 1/006 702/10 |
| 2005/0278127 | A1 | 12/2005 | Griffin et al. |
| 2007/0083338 | A1 | 4/2007 | Griffin et al. |
| 2014/0030092 | A1* | 1/2014 | Heinig ............... G01H 1/06 416/1 |
| 2014/0358500 | A1 | 12/2014 | Morris et al. |
| 2017/0286572 | A1 | 10/2017 | Hershey et al. |

OTHER PUBLICATIONS

Kaszynski et al. "Automated Finite Element Model Mesh Updating Scheme Applicable to Mistuning Analysis". Proceedings of ASME Turbo Expo 2014: Turbine Technical Conference and Exposition. 12 Pages. (Year: 2014).*

Krack, et al., "Vibration Prediction of Bladed Disks Coupled by Friction Joints", Jul. 25, 2016, Archives of Computational Methods in Engineering, Springer Verlag, 2017, 24 (3) pp. 589-636.

Feiner D. M. et al, "A Fundamental Model of Mistuning for a Single Family of Modes", ASME Journal of Turbomachinery, vol. 124, Oct. 2002, pp. 597-605.

Feiner D. M. et al, "Mistuning Identification of Bladed Disks Using a Fundamental Model of Mistuning—Part I: Theory," ASME Journal of Turbomachinery, 2004, 126(1), pp. 150-158.

Feiner D. M. et al, "Mistuning Identification of Bladed Disks Using a Fundamental Model of Mistuning—Part II: Application," ASME Journal of Turbomachinery, 2004, 126(1), pp. 159-165.

Griffin J. H. et al, "Model Development and Statistical Investigation of Turbine Blade Mistuning," Journal of Vibration, Stress, and Reliability in Design, vol. 106, Apr. 1984, pp. 204-210.

Griffin J. H. et al:, "Engineering a Breakthrough in Aircraft Safety", Department of Mechanical Engineering at Carnegie Mellon, Carnegie Mech, vol. 8, No. 1, Fall 2004, pp. 3-4.

Jastrzebski, et al. "Development of Morphed Ribcage Finite Element Models for Comparison with PMHS Data", paper No. IRC-17-107 presented at the 2017 International Research Council on Biomechanics of Injury conference.

Kaszynski, et al. "Automated Finite Element Model Mesh Updating Scheme Applicable to Mistuning Analysis", GT2014-26925, Proceedings of ASME Turbine Technical Conference and Exposition 2014, Dusseldorf, Germany.

Kaszynski, et al. "Uncertainties of an Automated Optical 3D Geometry Measurement, Modeling, and Analysis Process for Mistuned IBR Reverse Engineering", GT2013-95320, ASME Turbo Expo 2013.

Kaszynski, et al. "Experimental Validation of an Optically Measured Digital Replica of a Geometrically Mistuned Rotor Using a System ID Approach", 10.2514/6.2016-1371, AAIA SciTech Forum, 17th AAIA Non-deterministic Approaches Conference, Jan. 5-9, 2015.

Kaszynski, et al."Experimental Validation of a Mesh Quality Optimized Morphed Geometric Mistuning Model" GT2015-43150, Proceedings of ASME Turbo Expo 2015, Jun. 15-19, 2015, Montreal, Canada.

* cited by examiner

REFINEMENT OF FINITE ELEMENT MODEL OF INTEGRALLY BLADED DISK

This application is the United States national stage of international application number PCT/US2019/020230 filed on 1 Mar. 2019, which in turn claims benefit of the 24 Apr. 2018 filing date of U.S. provisional patent application No. 62/661,656.

FIELD OF THE INVENTION

This invention relates generally to the field of digital modeling of mechanical components such as the rotary disks of turbine engines.

BACKGROUND OF THE INVENTION

Integrally bladed disks (IBDs) are a relatively recent development in gas turbine engine technology. IBDs are bladed disks in which the blades and disk (or hub) form one continuous structure. The blades may be welded to the disk or formed integrally with the disk by being milled from a single block of material. IBDs are also referred to in the aerospace industry as blisks or as integrally bladed rotors (IBRs). While IBDs are becoming more popular in gas turbine aero engines, earlier traditional aero engine designs as well as many current industrial turbine and compressor designs have individual blades that are held in place by inserting them into slots in the disk.

Turbine blades on a bladed disk are part of a dynamic system with a complex vibratory response. For example, consider the difference in the vibratory response of a single turbine blade in isolation and a set of turbine blades mounted to a disk. A single turbine blade in isolation has mode shapes such as first bending and first torsion that generally have broadly spaced natural frequencies, resulting in a relatively simple vibratory response. However, when a set of turbine blades are mounted on a disk, they interact with each other, producing large numbers of modes with closely spaced frequencies and more complex dynamics. A disk with N blades will have N modes with similar frequencies in which the airfoils deflect in a first bending shape, and N modes with similar frequencies in which the airfoils deflect in a first torsion shape. These sets of modes with similar airfoil deflection patterns are referred to as mode families.

Ideally, all of the blades on a single disk are identical to each other, but this is not the case in reality. When it comes to vibration, no two IBDs are alike. Every IBD has a unique set of properties that causes it to vibrate differently from all other bladed disks, even those of the same design. Differences in individual blades due to manufacturing tolerances, wear, damage or repairs will cause them to vibrate at slightly different frequencies. This phenomenon of blades having different frequencies from each other is called mistuning. Because of mistuning and the associated complex vibrational behavior, some blades of an IBD can vibrate strongly while others are not vibrating at all. Blades with a higher vibratory response are more susceptible to high cycle fatigue damage, and because mechanical failure of a bladed disk is such a catastrophic event, there has been a long felt need by operators of turbine engines to be able to predict, and thereby to prevent, vibration-induced damage and associated failures.

Because manufacturing tolerances create part-to-part dimensional variations that have significance regarding an IBD's vibrational performance, it is known to adjust a finite element model (FEM) of an IBD to reflect the actual dimensions of a particular part; i.e. to construct a digital twin of a particular part. Such FEM built to measured dimensions is referred to as a Geometrically Mistuned FEM model. For example, the United States Air Force Research Laboratory presented a paper titled "Automated Finite Element Model Mesh Updating Scheme Applicable to Mistuning Analysis" at the 2014 ASME Turbine Technical Conference and Exposition describing a process for morphing the structured mesh of a nominal finite element model to reflect geometric data collected during an optical scan of an IBD. Other publications addressing this problem include: 1) GT2013-95320 "Uncertainties of an Automated Optical 3D Geometry Measurement, Modeling, and Analysis Process for Mistuned IBR Reverse Engineering", ASME Turbo Expo 2013; 2) GT2014-26925 "Automated Finite Element Model Mesh Updating Scheme Applicable to Mistuning Analysis", ASME Turbo Expo 2014; 3) 10.2514/6.2016-1371 "Experimental Validation of an Optically Measured Digital Replica of a Mistuned Rotor Using a System ID Approach", AAIA SciTech Forum, January 2015; and 4) GT2015-43150 "Experimental Validation of a Mesh Quality Optimized Morphed Geometric Mistuning Model" ASME Turbo Expo 2015. However, when the vibrational behavior predictions of such geometrically mistuned models are compared with experimental results, there remains a difference, most likely due to small residual dimensional measurement errors and possibly also due to small as-built material property variations.

A related problem has been addressed in the medical field where finite element models are used to evaluate how injuries occur in the human body, as discussed in paper IRC-17-107 titled "Development of Morphed Ribcage Finite Element Models for Comparison with PMHS Data" presented at the 2017 International Research Council on Biomechanics of Injury conference. U.S. Pat. No. 9,710,880 B2 titled "User Guided Shape Morphing in Bone Segmentation for Medical Imaging" issued on Jul. 18, 2017. However, the medical field is concerned about static loads on the human body, not high order dynamic loading.

Morphing of models is also useful when identifying objects in an image, as described in U.S. Pat. No. 5,590,261 titled "Finite-Element Method for Image Alignment and Morphing" issued on Dec. 31, 1996. Imaging applications are not concerned with high order vibrational motion.

Process and model refinements over the past few years have continued to improve the correspondence between geometrically mistuned FEM predictions and experimental results for IBD's, but recent evaluations have found that even geometrically mistuned models are unable to predict blade mistuning frequencies for some mode families with a desired degree of accuracy. Because blade vibratory response is so highly sensitive to blade frequency, continued improvement in the analytical modeling of IBDs is desired.

SUMMARY OF THE INVENTION

A technique is presented herein to update a finite element model so that it better fits the experimental vibration signature of an as-is part, thereby enabling the use of the model for predictive analysis of the impact of a proposed modification of the part. The present inventor has found that finite element models that have been constructed to reflect optical scanning dimensional measurements are able to correct some (75%-80%) of the total frequency mistuning mismatch between the design basis FEM predictions and experimental results, but a residual amount (20-25%) of the mistuning mismatch remains when compared to experimental results. This situation can be described as follows:

$$\delta\omega_{total} = \delta\omega_{geom} + \text{residual} \quad \text{(Equation 1)}$$

The present invention involves using a reduced order model (ROM) of the IBD to determine the mistuning residual for each blade, then applying a residual mistuning correction to the finite element model so that the refined model more closely predicts the experimentally determined vibrational behavior of the blades for one or more mode families. The mistuning correction may be applied to the finite element model as a small density, modulus or dimensional adjustment to a blade, as examples. The refined model may then be used with improved confidence for further analysis of that particular IBD, such as when predicting and/or evaluating the effect of a repair of the IBD. Thus, the invention improves upon existing digital modeling technology and allows it to be extended into the field of predictive vibrational analysis and turbine engine fleet management.

BRIEF DESCRIPTION OF THE DRAWINGS

The invention is explained in the following description in view of the drawings that show.

DETAILED DESCRIPTION OF THE INVENTION

Figure 1:
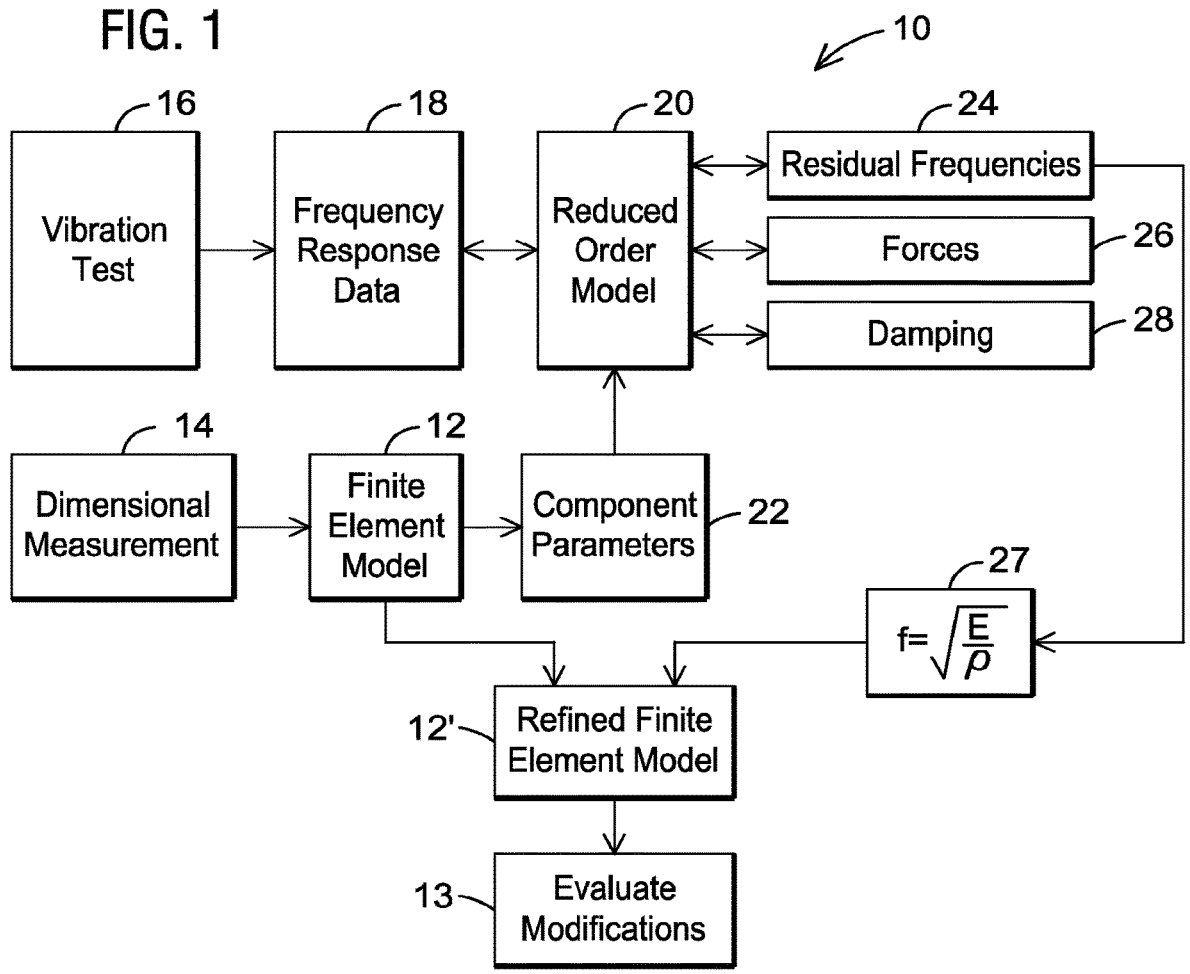
FIG. 1 is a schematic illustration of an embodiment of the invention where residual mistuning is determined directly.

Introduction—Use of a Reduced Order Model (ROM)

In structural mechanics, a reduced order model is a simplified approach to modeling the vibratory response of a structure using a smaller number of degrees of freedom than a standard finite element model used for design of the structure. The number of degrees of freedom in a formulation is the number of parameters needed to describe its physical state.

The standard method used by turbine manufacturers for calculating stresses and displacements and for predicting the vibratory response of turbine blades is the finite element method or finite element analysis (FEA). A finite element model (FEM) divides a blade into hundreds, thousands, tens of thousands or even more small elements. Commercial finite element programs sold under trademarks or trade names such as NASTRAN, ANSYS and ABAQUS have been developed and are widely used to model turbine components. These programs can automatically generate a finite element model of the component using as input a computer aided design (CAD) model that defines the geometry of the part. The physical location of each element is defined by the physical location of nodes. In addition, the motion of the element, the strain and the stresses of the material within each element are defined in terms of the motion of the nodes. Usually, each node has at least three degrees of freedom that define its location. So a rough estimate of the number of degrees of freedom in a finite element model of a structure is three times the number of nodes.

Typically, the more elements used in a finite element model, the more accurately it represents the physical behavior of the structure it models. In the case of vibratory response, it is desired to be able to calculate the natural frequencies and mode shapes of a blade. If more elements are used in representing the blade's geometry, then the finite element model calculates the frequencies of more modes within a certain accuracy. The accuracy that is needed depends upon the application. A fairly crude model may be adequate if it is only needed to determine the frequencies of the blade to within a couple of percent. However, if the goal is to predict how a full bladed disk would vibrate if the blades had slightly different frequencies (the mistuning problem), then a model of each blade that predicts its natural frequencies to within 0.1% is needed.

A study was done to determine how element size affects errors in predicting natural frequencies. In this study, a sequence of finite element models was created with different numbers of elements and was used to calculate natural frequencies for the twenty lowest frequency modes. The model with the coarsest mesh had 26,000 nodes. Examination of the results from the finite element analyses show that if it is desired to know the frequencies of only the first two modes within 0.1%, then the finite element model needs to have at least 60,000 nodes. Alternatively, if it is desired to know the frequencies of all twenty modes within 0.1%, then the model would have to have at least 140,000 nodes. Consequently, how many nodes and degrees of freedom that are needed in a finite element model depends upon the accuracy that is needed and the frequency of the mode you want to represent—the higher the frequency the more nodes are needed. If it were desired to construct a finite element model of a full bladed disk that has 50 blades, and if it were desired to use that model to calculate the modes of the system in which the blades vibrated in their $20^{th}$ blade mode, each blade would have to be represented by 140,000 nodes. Consequently, a finite element model of the full rotor with the fidelity required to do a mistuning analysis would require seven million nodes (50×140,000) to represent the blades. Since each node has three degrees of freedom, we can estimate that a finite element model with more than 20,000,000 degrees of freedom would be needed to calculate the mistuned response of the full bladed disk assembly up through the frequency of the $20^{th}$ blade mode. Consequently, for the purposes of accurately modeling the mistuned vibratory response of a full bladed disk, the number of degrees of freedom per blade for a representative finite element model would need to be in the range of hundreds of thousands of degrees of freedom per blade. Considering the level of today's computing capability, such large models are not commercially practical for the management of a fleet of production machines.

The number of degrees of freedom used in a reduced order model depends upon the number of modes it represents and the sophistication of the model. It is noted that a number of reduced order models are known in the art and could be used with the present invention. One such model is the Fundamental Mistuning Model (FMM) described in U.S. Pat. No. 7,082,371 B2, incorporated by reference herein. That model represents one isolated family of modes at a time. An isolated family of modes is a group of modes that have similar frequencies and that are separated from other mode families, such as by a kilohertz in one example. If there are N blades on the rotor, then there are N modes in an isolated family. An FMM model can use up to 6N parameters to completely define the vibratory state of a bladed disk for one isolated family of modes. Suppose there are M families of modes that it is desired to represent for a particular type of IBD. Then a total of 6 NM parameters are needed to represent the vibratory state of the IBD using FMM representations of the modes, i.e. you need 6 times the total number of modes. For example, if there are 20 mode families of interest for an IBD with 50 blades, FMM would need up to 300 parameters per mode family for a total of 6,000 parameters to completely define the twenty FMM models needed to represent the IBD's vibratory response. Six thousand parameters is a relatively small number compared with the number of parameters needed to define a full finite element model of the same IBD in a way that the finite element model accurately represents the IBD's mistuned vibratory response. For example, it is possible to compute the frequency responses of about 1,000 IBDs per second on a desktop computer using the FMM reduced order model, while it could take hours or even days to compute the frequency response of even one IBD with a finite element model of a full rotor that individually models the geometric variations in each blade.

There are more sophisticated reduced order structural models than the original FMM. For example, the assignee of the present invention has also developed an extension of FMM that simultaneously models two families of modes that interact, i.e. their natural frequencies overlap. In this case, the two-family FMM model requires additional parameters to capture the interaction between the two families of modes. For this extended two-family FMM model, the total number of parameters needed to represent the vibratory state of the modes is equal to 10 times the number of modes being represented by the model. Thus, the present inventor defines the term "reduced order model" as used herein so that it allows for further improvements in the sophistication of the models that are used to represent the vibratory response of a bladed disk. Consequently, a "reduced order model" is defined here as one in which the number of parameters used to define the vibratory response is less than 100 times the number of modes being represented. This is significantly more than the number of parameters being used in current reduced order models of IBDs, but more than an order of magnitude less than the number of parameters that are needed if a finite element model of the bladed disk were used to accurately model the vibratory response of the full, mistuned bladed disk.

Inherent in this definition of a reduced order model of an IBD is the concept that the vibratory responses of the blades are coupled and must be analyzed as a system. As a result, elementary models that represent the vibratory response of only a single, uncoupled blade are excluded from this definition of a reduced order model of the bladed disk. An example of such an elementary model is a simple mass/spring/dashpot system. The shortcoming of such a simple model is that it only has one peak frequency response, and it cannot represent the more complex, multiple peak frequency responses that exist in real IBDs.

Relationship of Reduced Order Model and Finite Element Model

Mistuning is caused by blade-to-blade differences in geometry and material properties. Therefore, if a blade has thousands of nodes, then there will be thousands of parameters needed to define that blade's mistuning. In contrast, some ROMs are able to model each blade's mistuning using a much smaller number of parameters, often just one per blade. Accordingly, the present inventor has found a reduced order model to be particularly useful for addressing the problem of how to refine a finite element model to better fit experimental vibration data.

Both a finite element model and a reduced order model can be used to predict the vibrational response of the IBD to an excitation. Because an FEM can be used to model engine effects such as centrifugal stiffening and temperature effects, it is useful in certain fleet management activities, such as predicting the impact of a proposed repair (blend) or other modification of an IBD.

Accordingly, the present inventor obtains experimental vibration data, then processes it through a reduced order model to identify refinements to a finite element model that better conform the FEM predictions to the experimental vibration data. In one embodiment, the refinements are expressed in the FEM as density perturbations to be implemented for each respective sector/blade of the IBD, although other parameter(s) affecting frequency may be changed, including dimensional and/or material property parameters. The reduced order model may be the Fundamental Mistuning Model discussed above, or another available model using known reduced order modelling techniques such as component modal synthesis (CMS), subset of nominal modes (SNM), component mode mistuning (CMM), etc.

Exemplary Embodiment

FIG. 1 illustrates aspects of a method 10 in accordance with an embodiment of the invention where the residual mismatch component of Equation 1 above is determined directly.

A finite element model (FEM) 12 is prepared to model a component such as an integrally bladed disk (IBD) of a turbine engine. The FEM 12 may be developed during the design of the IBD in accordance with standard mechanical design methodologies wherein every sector of the bladed disk is assumed to be identical and is then adjusted to reflect actual measured dimensions 14 of a particular subject IBD. The FEM of the measured geometry may be constructed entirely from measured geometric data or with a combination of measurement and design intent geometry.

The subject IBD is exposed to a mechanical excitation in a testing step 16, and its vibration signature measured. This can be accomplished during operation of the IBD in an engine, in a spin-pit, or in a stationary environment. A preferred method is a stationary environment test using an automated vibration measurement system using non-contact acoustic speakers that can be controlled to generate any desired order and magnitude of driving forces while simultaneously measuring displacement or velocity at selected locations along the component using a highly sensitive laser vibrometer. The assignee of the present invention provides one such system under the trademark EzVIBES.

The raw displacement data is devolved into frequency response data at step 18 which is used as an input to a reduced order model 20. The reduced order model 20 also receives as input from the finite element model 12 various component parameters 22 describing the structure of the IBD, for example mode shapes, natural frequencies, mass matrix and nodal coordinates.

Figure 2:
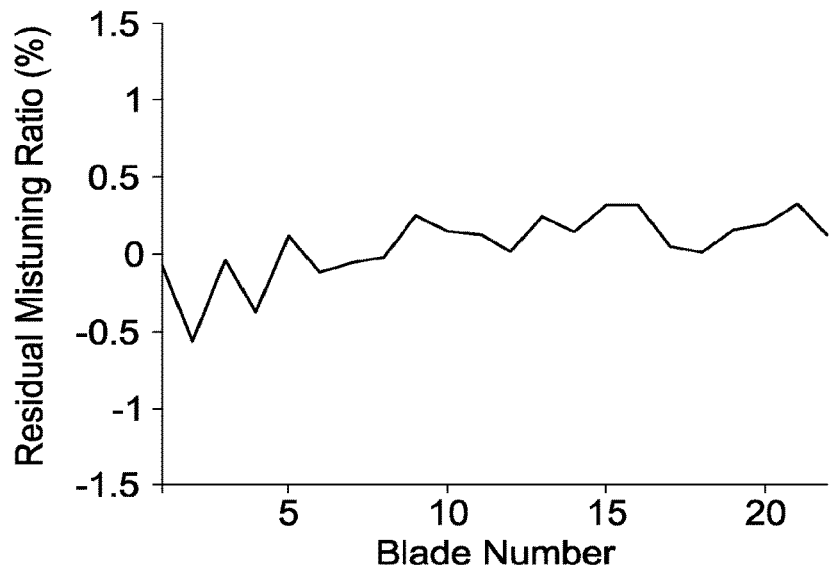
FIG. 2 is an exemplary output of a reduced order model illustrating the residual mistuning of each sector of an IBD.

The reduced order model 20 is then used to calculate 24 the residual mistuning of each sector of the IBD. The reduced order model 20 may also be used to calculate forces 26 and damping 28. The residual mistuning is responsible for the difference between a vibrational response predicted by the finite element model 12 and the vibrational response actually observed during the vibration test 16. The residual mistuning may be expressed in terms of a residual mistuning ratio (%) for each blade/sector of the IBD, as shown in FIG. 2, where 0% indicates a perfect prediction of experimental results by the FEM 12. The residual mistuning may also be expressed as (or converted to) density at step 27, since frequency (f) and density (ρ) are interrelated by the elastic modulus E of the material, as expressed in equation 2.

$$f = \sqrt{\frac{E}{\rho}} \qquad \text{(Equation 2)}$$

The residual mistuning information is then used to create a refined finite element model 12', such as by applying the respective residual for each blade as a density (and/or dimension and/or material property) adjustment to the finite element model 12. The refined FEM 12' may then be used at step 13 to evaluate the effect of a physical modification to the IBD, as will be described more fully below in view of the discussion of FIG. 6.

Figure 3A:
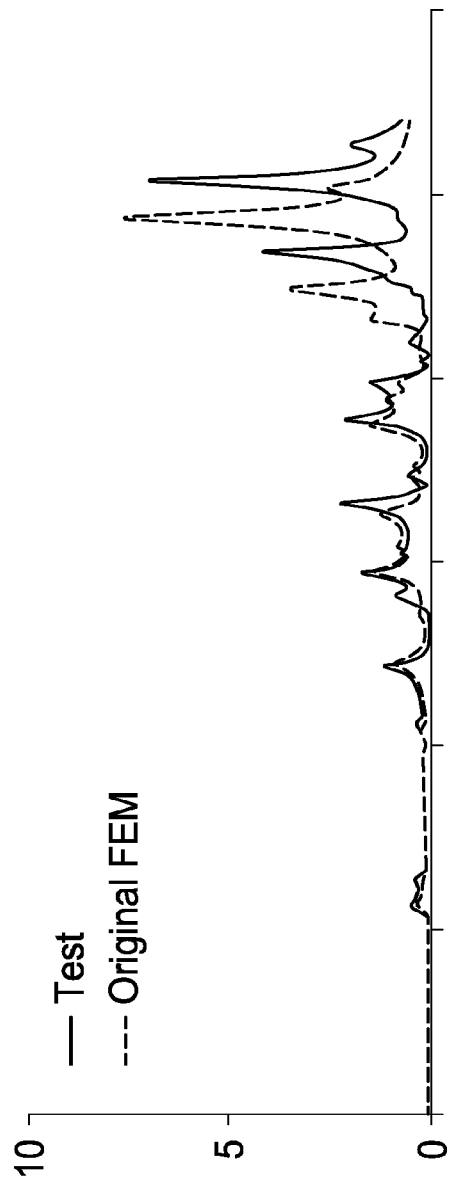
FIG. 3A illustrates the mismatch between the prediction of a prior art finite element model and experimental results, showing velocity verses frequency.
Figure 3B:
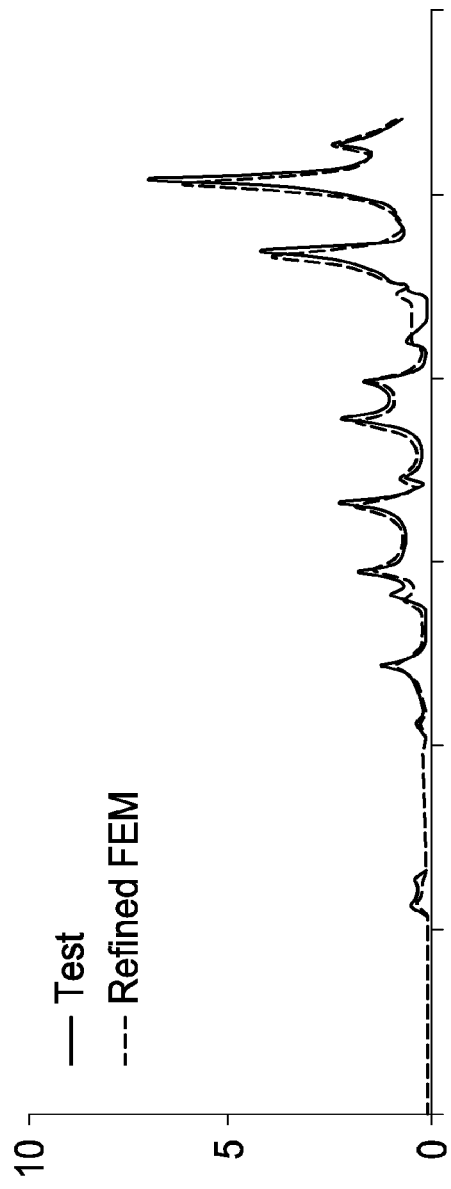
FIG. 3B illustrates the mismatch between the prediction of a finite element model refined in accordance with an embodiment of the invention and experimental results.
Figure 4A:
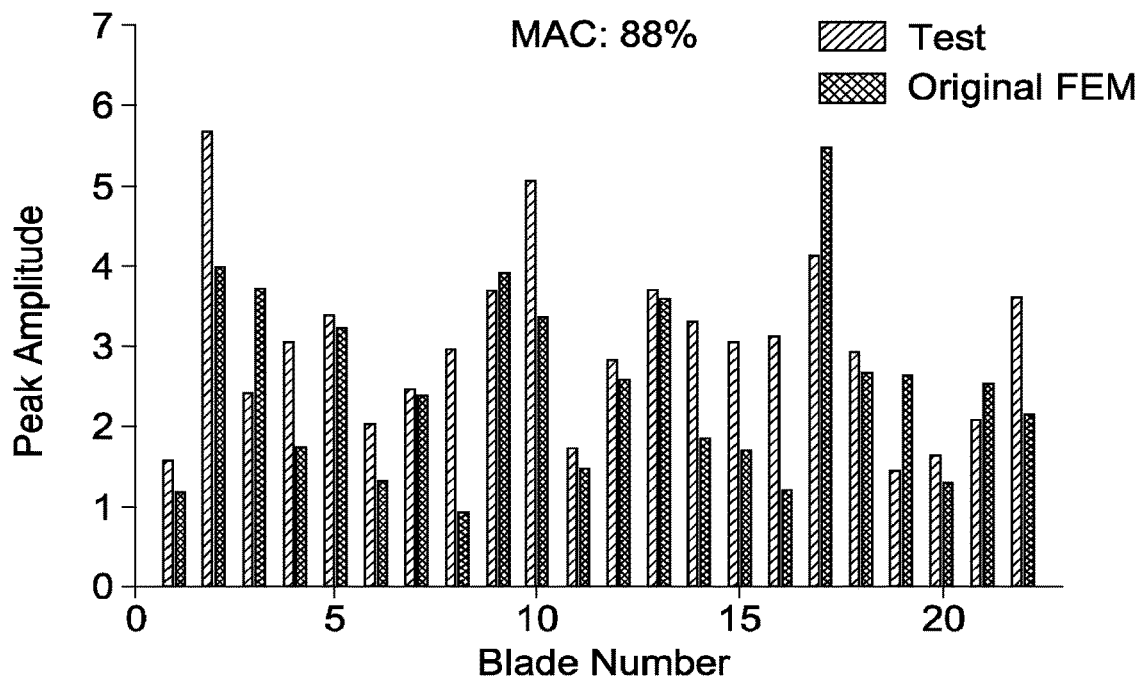
FIG. 4A illustrates the peak amplitude determined for each blade of the IBD using a prior art finite element model as compared to experimental results.
Figure 4B:
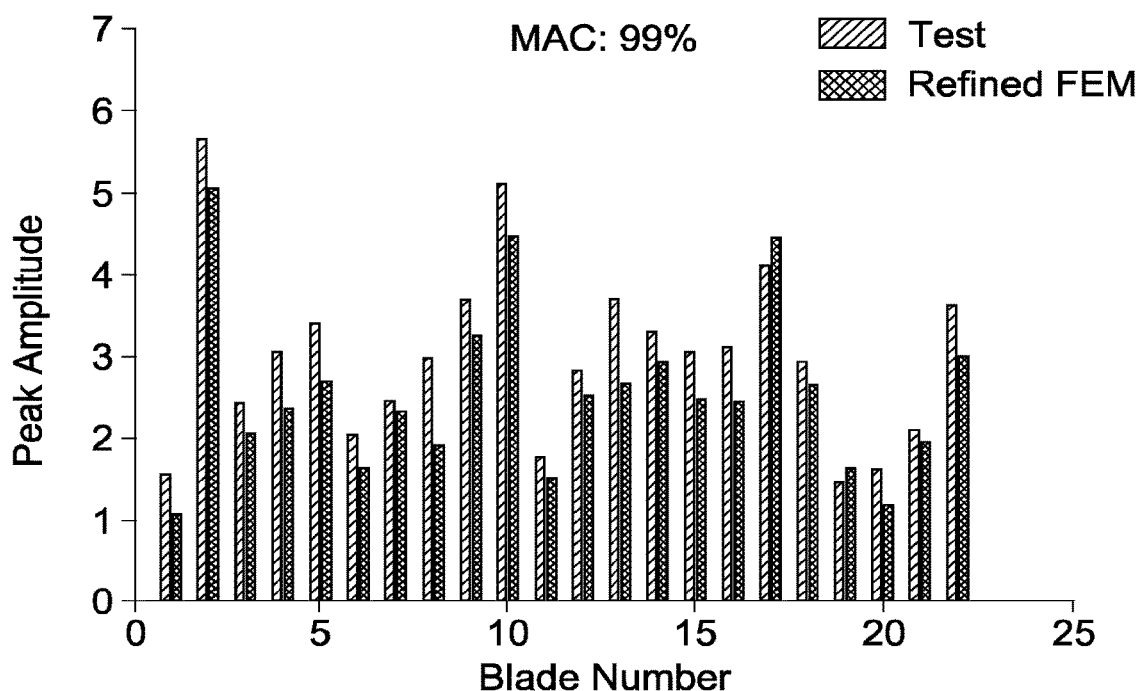
FIG. 4B illustrates the peak amplitude determined for each blade of the IBD using a finite element model refined in accordance with an embodiment of the invention as compared to experimental results.

The process of FIG. 1 has been demonstrated to be effective for its intended purpose. FIG. 3A is a modal summation illustration of the mismatch between the prediction of a prior art finite element model and experimental results for a point on the leading edge of a blade of an exemplary IBD. FIG. 3B is a modal summation illustration of the mismatch between those same experimental results and the prediction of the same finite element model after it had been refined in accordance with the method of FIG. 1. Similar improvement was achieved across the entire IBD, which can be appreciated by illustration of the peak amplitude determined from the modal summations for each blade of the IBD using the original prior art FEM (FIG. 4A) and using the refined FEM (FIG. 4B) as compared to the experimental results.

Alternative Embodiment

Figure 5:
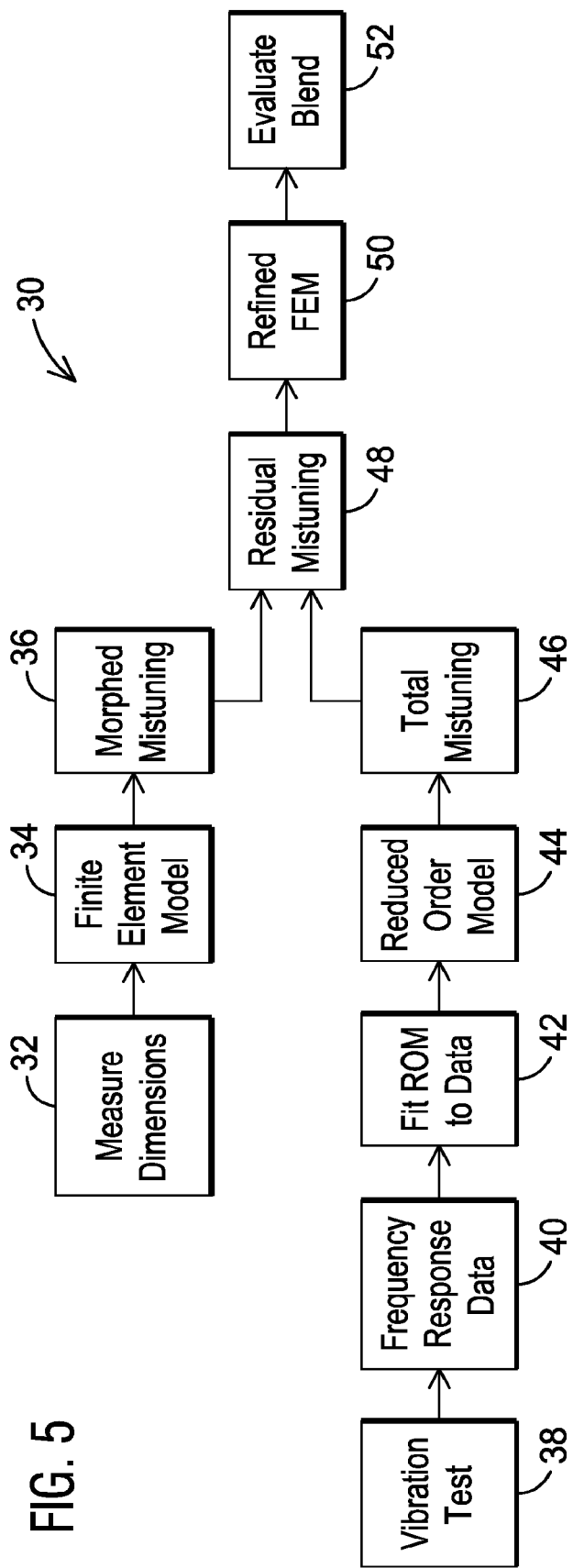
FIG. 5 is a schematic illustration of an embodiment of the invention where residual mistuning is determined indirectly.

FIG. 5 illustrates aspects of a method 30 in accordance with an embodiment of the invention where the residual mistuning is calculated by first determining the other components of Equation 1 above (i.e. $\delta\omega_{total}\delta\omega_{geom}$).

As in FIG. 1, dimensional measurements are determined 32 for a subject IBD and are used to create a finite element model that matches the measured geometry (a geometrically mistuned FEM) 34. The geometrically mistuned FEM 34 is then used to calculate the blade mistuning frequencies 36, which represent the $\delta\omega_{geom}$ element of Equation 1.

In parallel, the subject IBD is subjected to a mechanical excitation in a testing step 38, such as in an operating engine or in a bench testing system such as sold under the trademark EzVIBES by the assignee of the present invention. The raw displacement data from the test is devolved into frequency response data at step 40, which is used at step 42 to determine parameters that best fit a reduced order model (ROM) 44 to the test data 40. The assignee of the present invention has developed software, sold under the trademark EzID, which is useful for the performing step 42 and which identifies structural properties of the IBD as well as information about the test, thereby allowing the identification of the total mistuning ($\delta\omega_{total}$) of the IBD at step 46. The residual is then calculated at step 48 in accordance with Equation 1 as the difference between $\delta\omega_{total}$ and $\delta\omega_{geom}$, and the residual is then used to create a refined finite element model 50.

Blending Application of Invention

Because an FEM refined in accordance with the above-described methods is highly accurate in predicting the frequency response of an IBD, the present invention now allows a finite element model to be used as a predictive tool in ways not previously possible. For example, the present invention includes using the refined geometrically mistuned finite element model 12' of FIG. 1 (or 50 of FIG. 5) to evaluate (step 13 of FIG. 1 or step 52 of FIG. 5) a proposed blend or other repair/modification/wear of the IBD before metal is actually removed from the part in order to confirm that the resulting geometry will have an acceptable vibratory response when subjected to engine operating loads and temperatures.

Figure 6:
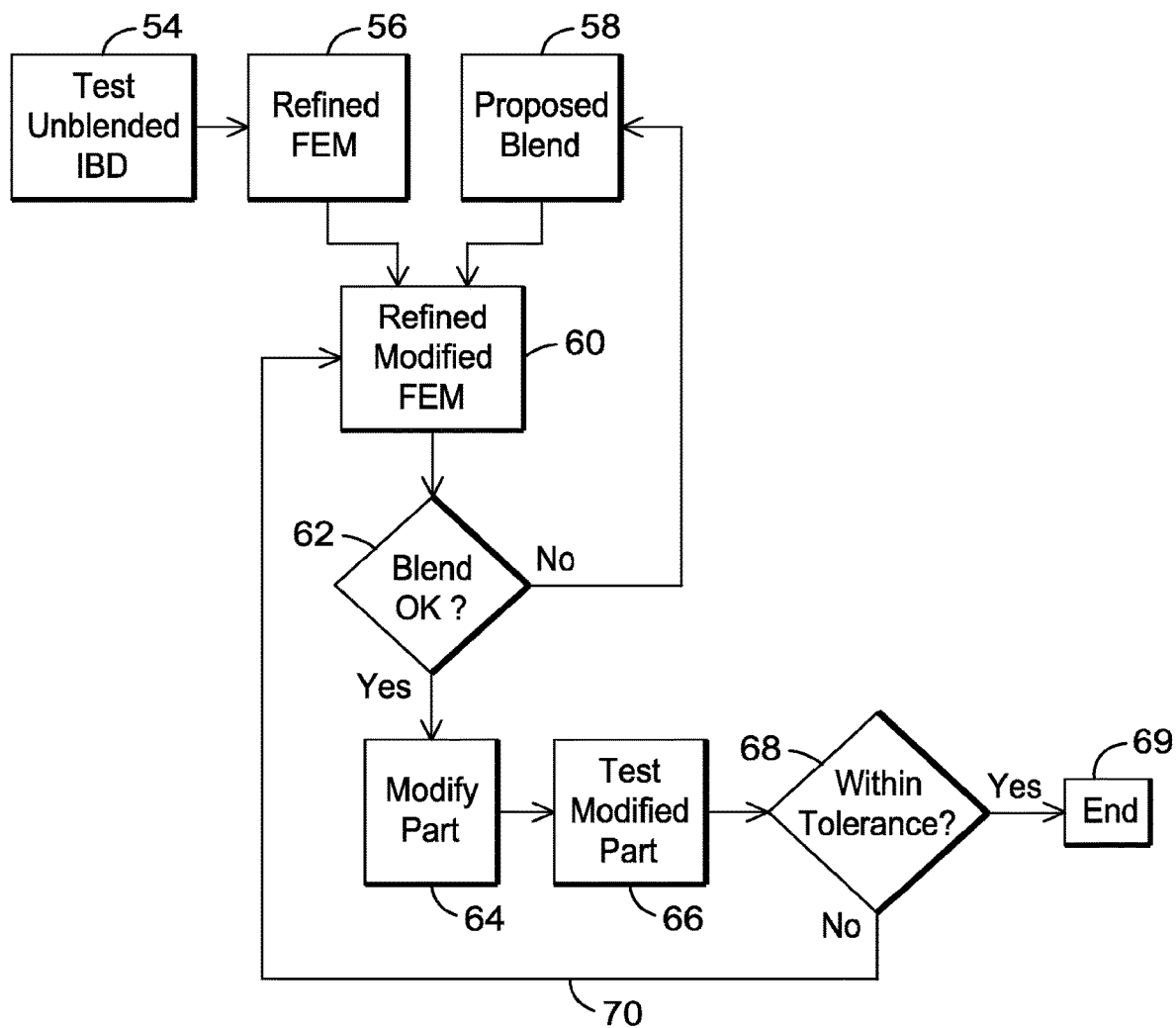
FIG. 6 illustrates a method of evaluating a repair process in accordance with an embodiment of the invention.

FIG. 6 illustrates additional detail about how this evaluation may be accomplished. A subject IBD is tested 54 at step to determine its actual dimensions and its actual vibration signature, as described above with regard to FIGS. 1 and 5, and a refined finite element model 56 is generated. A proposed physical change to the IBD 58, such as a proposed repair blend or a predicted wear pattern, is then added to the refined FEM 56 to yield a refined model of the modified IBD 60. The refined model of the modified IBD 60 is then used to evaluate 62 a forced response of the part under engine operating conditions to determine if the proposed change is acceptable. If not, a revised physical change may be proposed by returning to step 58, and if so, the physical change is made to the IBD at step 64.

It is further possible to again test the physically modified IBD at step 66 to confirm 68 that the actual physically modified dimensions conform to the planned/analyzed modifications within any defined acceptance tolerance. This step may be particularly useful when the modification is done manually, such as by grinding to remove a service-induced crack. Should the actual dimensions of the modification deviate from the planned dimensions by an unacceptably large amount, or to be conservative in all cases, the finite element model may be further refined 70 and the forced response of the part again evaluated. Alternatively or in addition to evaluating the modifications from a geometric viewpoint, the modified IBD may again be subjected to a vibration test at step 66 to derive a further residual mistuning for use in further refining the FEM.

Hardware Embodiment

Figure 7:
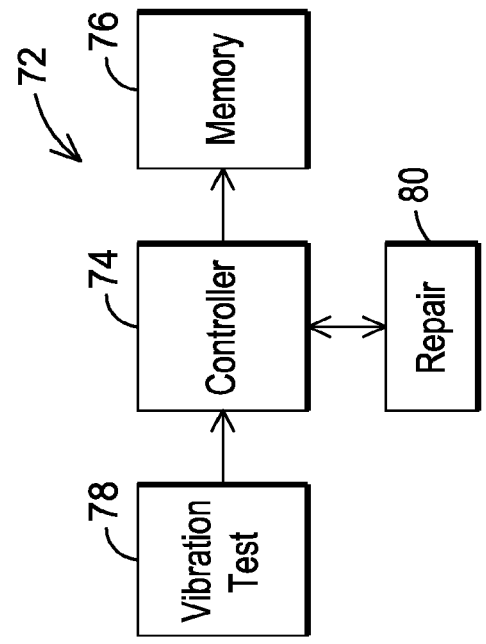
FIG. 7 is a block diagram illustrating a system in accordance with an embodiment of the invention.

While the invention is necessarily rooted in computer technology because it solves a problem in the realm of digital modeling of mechanical components, it can nonetheless be embodied as a hardware system. One such system 72 is illustrated in FIG. 7, where a controller 74 has two-way access to a memory 76 which may contain information such as test data, operational data, repair data, digital models, etc. The controller 74 is programmed with instructions for executing the steps of the processes illustrated in FIGS. 1, 5 and 6 and described above. The memory 76 may include information regarding a fleet of components of similar design. A vibration test device 78 is in communication with the controller 74 for obtaining the vibration signature of a subject component. The vibration test device 78 may be associated with an operational machine for collecting vibration information during actual operation of the subject component, or it may be a dedicated test apparatus such as an EzVIBES™ tester provided by the assignee of the present invention. A repair element 80 may also be associated with the controller 74 directly or indirectly, for example embodied as a computer-controlled machining device. In other embodiments, the repair element 80 may be a manual repair location, such as used for manual grinding and/or weld repair of the subject component. The various elements of system 72 may be co-located such as in a maintenance or repair depot, or they may be separated physically and interconnected directly or indirectly. The invention enables the preparation of a reduced order model, obtaining component vibration data, utilizing the component vibration data with the reduced order model to evaluate a finite element model, and the refinement of the finite element model so that it better predicts the actual vibrational response of a component or a proposed modification to a component. The invention represents an innovation to existing digital modelling technology by using a reduced order model and test data to develop an improved finite element model, thereby enabling the extension of the use of the finite element model into the area of predictive analysis of component modifications. Accordingly, the invention, when taken as a whole, represents significantly more than an abstract ideal, and it is properly considered patentable subject matter.

While various embodiments of the invention have been shown and described herein, it will be obvious that such embodiments are provided by way of example only. Numerous variations, changes and substitutions may be made without departing from the invention herein.

We claim as our invention:

1. A method comprising using a reduced order model of a component and vibratory test data of the component to refine a finite element model of the component, wherein the component is an integrally bladed disk (IBD), further comprising:
   measuring dimensions of the IBD;
   constructing a geometrically mistuned finite element model of the IBD to reflect the measured dimensions;
   obtaining a reduced order model of the IBD reflecting characteristics of the IBD output from the geometrically mistuned finite element model;
   measuring an actual vibratory response of the IBD;
   using the actual vibratory response as input to the reduced order model to calculate a residual mistuning of the IBD not predicted by the geometrically mistuned finite element model; and
   refining the geometrically mistuned finite element model to reduce the residual mistuning.

2. The method of claim 1, further comprising using the refined finite element model to evaluate a proposed modification of the component.

3. The method of claim 1, wherein the step of refining the geometrically mistuned finite element model comprises changing a density of a segment in the geometrically mistuned finite element model.

4. The method of claim 1, wherein the step of refining the geometrically mistuned finite element model comprises changing a dimension of a segment in the geometrically mistuned finite element model.

5. The method of claim 1, wherein the step of refining the geometrically mistuned finite element model comprises changing a modulus of a segment in the geometrically mistuned finite element model.

6. The method of claim 1, further comprising using the refined geometrically mistuned finite element model to evaluate a change in geometry of the IBD.

7. The method of claim 1, further comprising using the refined geometrically mistuned finite element model to evaluate a change in geometry of the IBD before the change is actually implemented on the IBD.

8. The method of claim 7, wherein the change in geometry is a blend, and further comprising:
   proposing the blend in the IBD;
   using the refined geometrically mistuned finite element model to evaluate the IBD with the proposed blend; and
   implementing the proposed blend in the IBD only if the evaluation of the IBD with the proposed blend is acceptable.

9. A method comprising using a reduced order model of a component and vibratory test data of the component to refine a finite element model of the component, wherein the component is an integrally bladed disk (IBD), further comprising:
   measuring a vibration signature of the IBD responsive to an excitation;
   calculating mistuned blade frequencies of the IBD using the vibration signature as an input to a reduced order model of the IBD;
   calculating mistuned blade frequencies of the IBD using a finite element model of the IBD;
   comparing the mistuned blade frequencies of the IBD calculated with the reduced order model and the mistuned blade frequencies of the IBD calculated with the finite element model to determine a residual mistuning; and
   refining the finite element model to reduce the residual mistuning.

10. The method of claim 9, wherein the step of refining the finite element model comprises changing a density of a segment in the finite element model.

11. The method of claim 9, wherein the step of refining the finite element model comprises changing a dimension of a segment in the finite element model.

12. The method of claim 9, wherein the step of refining the finite element model comprises changing a modulus of a segment in the finite element model.

13. The method of claim 9, further comprising:
   constructing a geometrically mistuned finite element model of the IBD to reflect measured dimensions of the IBD;
   using the geometrically mistuned finite element model in the step of calculating mistuned blade frequencies of the IBD using the finite element model; and
   refining the geometrically mistuned finite element model to reduce the residual mistuning.

14. The method of claim 9, further comprising using the refined finite element model to evaluate a change in geometry of the IBD.

15. The method of claim 9, further comprising using the refined finite element model to evaluate a change in geometry of the IBD before the change in geometry is actually implemented on the IBD.

16. The method of claim 15, wherein the change in geometry is a blend, and further comprising:
 proposing the blend in the IBD;
 using the refined finite element model to evaluate the IBD with the proposed blend; and
 implementing the proposed blend in the IBD only if the evaluation of the IBD with the proposed blend is acceptable.

\* \* \* \* \*